United States Patent [19]

Chamran et al.

[11] 4,037,154
[45] July 19, 1977

[54] CIRCUIT FOR CALIBRATING INSTRUMENTS

[75] Inventors: Morteza M. Chamran, Elmhurst; Allen R. Nemec, Naperville, both of Ill.

[73] Assignee: The Perkin-Elmer Corporation, Norwalk, Conn.

[21] Appl. No.: 723,372

[22] Filed: Sept. 15, 1976

[51] Int. Cl.² .......................... G01R 1/30; G01R 1/02
[52] U.S. Cl. .................................. 324/123 R; 324/74; 330/112
[58] Field of Search .................. 324/123 R, 130, 74; 330/9, 112

[56] References Cited

U.S. PATENT DOCUMENTS 3,264,569  8/1966  Lefferts .............................. 330/112
3,484,692  12/1969  Lode ................................. 324/123 R Primary Examiner—Rudolph V. Rolinec
Assistant Examiner—Ernest F. Karlsen
Attorney, Agent, or Firm—S. A. Giarratana; F. L. Masselle; J. D. Crane

[57] ABSTRACT

A circuit permitting an operator to accurately calibrate an instrument to indicate when a variable analog quantity being measured is zero. The analog signal is connected to the input of an operational amplifier which operates in stable mode for large analog inputs and operates in oscillation mode for very small analog inputs. The output of the operational amplifier is compared to zero and when the analog input is greater than zero, the comparator output is a logic zero. When the analog input is less than zero and not in the immediate vicinity of zero, the comparator output is a logic one. When the analog input is very small and less than zero, the operational amplifier operates in oscillation mode as the circuitry connected thereto causes it to oscillate with the duty cycle of the negative portion of the oscillation decreasing as the analog input comes closer to zero. Accordingly, the output of the comparator also oscillates. The comparator output connects to a sign driver of a typical seven segment display and the sign indication provided thereby grows dimmer as the analog input approaches zero from the negative direction.

10 Claims, 1 Drawing Figure

CIRCUIT FOR CALIBRATING INSTRUMENTS

BACKGROUND OF THE INVENTION

The invention relates to the field of analog instrumentation and particularly to circuits used in calibrating analog instruments to correctly respond when the analog signal being measured is zero.

In analog instruments such as instruments for quantitative photometric analysis, the level of a signal such as the photometric signal is calibrated at a zero level (zero percent transmittance) and at a 100% level (100% transmittance) and the accuracy of the instrument is dependent on being able to accurately indicate both the zero and the 100% level. To achieve the desired accuracy, the instrument typically includes a calibration circuit which simulates the signal at the zero and 100% level and includes circuit calibration controls to adjust the display output to indicate the correct input magnitude and polarity at these levels.

Correctly calibrating an instrument is typically more critical at the zero level than at the 100% level because a small calibration error at the zero level may contribute an error which is substantial as compared to the quantity actually being measured. For example, if a typical transmittance measurement instrument were calibrated by an operator by simply adjusting the calibration controls until the instrument output reads zero to correspond to zero percent transmittance (T), the instrument may actually be responding to a signal between $-0.07\%T$ and $+0.07\%T$. Accordingly, the zero indication for the instrument can easily be set improperly so that subsequent measurement near the zero % transmittance level are subject to being inaccurate due to the failure to properly adjust the instrument to indicate zero when in actuality the input was zero.

Typically, this problem in prior analog instruments has been addressed by providing high gain amplifiers ahead of a comparator circuit to amplify the analog signal so that even a small analog voltage can be indicated as being other than zero by a comparator. The difficulty with this approach, however, is that the operator has no indication during adjustment of the calibrating control as to how close the zero point really is. The only indication provided by such circuits is the abrupt change in the digital state at the comparator which occurs after the calibration control has adjusted the instrument through zero. As the only change is an abrupt change, the operator may acutally have advanced the calibrating control beyond the zero point before he can react to the change in output state. As such, accurate calibration at the zero level is very difficult to achieve by this method. Analog meters such as electro mechanical volt meters can be used where low accuracy is acceptable but where more precise measurement is required, they cannot be ued to calibrate an instrument at the zero point. Analog to digital instruments such a A/D volt meters with many digits can be used but the cost is frequently prohibitive.

SUMMARY OF THE INVENTION

In view of the foregoing difficulties, it is an object of the invention to provide an inexpensive circuit useful in calibrating analog instruments which provides an indication when the instrument is properly calibrated to read zero when the input to the instrument is zero.

It is still a further object of the invention to provide a calibrating circuit for an analog instrument capable of indicating when the instrument is accurately calibrated at zero wherein the accuracy of the zero indication exceeds the accuracy of the instrument when it is reading zero.

It is yet another object of the invention to provide a circuit useful during calibrating an instrument to provide the operator with an indication as to how close he is to actually setting the calibrating control at the point where the instrument reads zero when the input is actually zero.

In achieving these and other objects of the invention, the present improved calibrating circuit includes a high gain operational amplifier which operates in stable mode for analog inputs above a given threshold but operates in oscillation mode for small analog inputs, i.e., inputs below a given threshold voltage. The output of the operational amplifier is coupled to the input of a second operational amplifier configured as a voltage comparator. For analog inputs to the first operational amplifier having a magnitude in excess of the threshold voltage, the output of the second operational amplifier has either a logic one or a logic zero level to indicate the polarity of the analog input signal. When the analog input to the first operational amplifier is below the threshold in magnitude, it no longer operates in stable mode but in an oscillation mode and the output of the first operational amplifier oscillates due to circuitry connected thereto. This oscillating signal is compared by the comparator to zero. As the input to the first operational amplifier comes closer and closer to actual zero, the duty cycle of the negative portion of the oscillating signal from the first operational amplifier becomes lower thereby reducing the positive duty cycle at the output to the comparator as well. If the comparator is coupled to a visual display such as the sign bar of the typical seven segment display, the illumination intensity of the sign bar will change as the positive duty cycle changes. Accordingly, the intensity of the sign bar on the display diminishes as the analog input to the first operational amplifier comes closer and closer to actual zero. When an operator adjusts the instrument during calibration so that the minus sign just goes out, the instrument is accurately calibrated so that a zero reading on the instrument actually corresponds to the zero level of the analog signal being measured thereby.

DESCRIPTION OF THE DRAWING

The foregoing and other objects, advantages, and features of the invention will be described below in greater detail in connection with the sole drawing which comprises a circuit diagram for the circuit according to the invention which provides an operator with an indication as to proximity of a circuit being accurately calibrated to read zero when in fact the input is zero.

DETAILED DESCRIPTION

Figure 1:
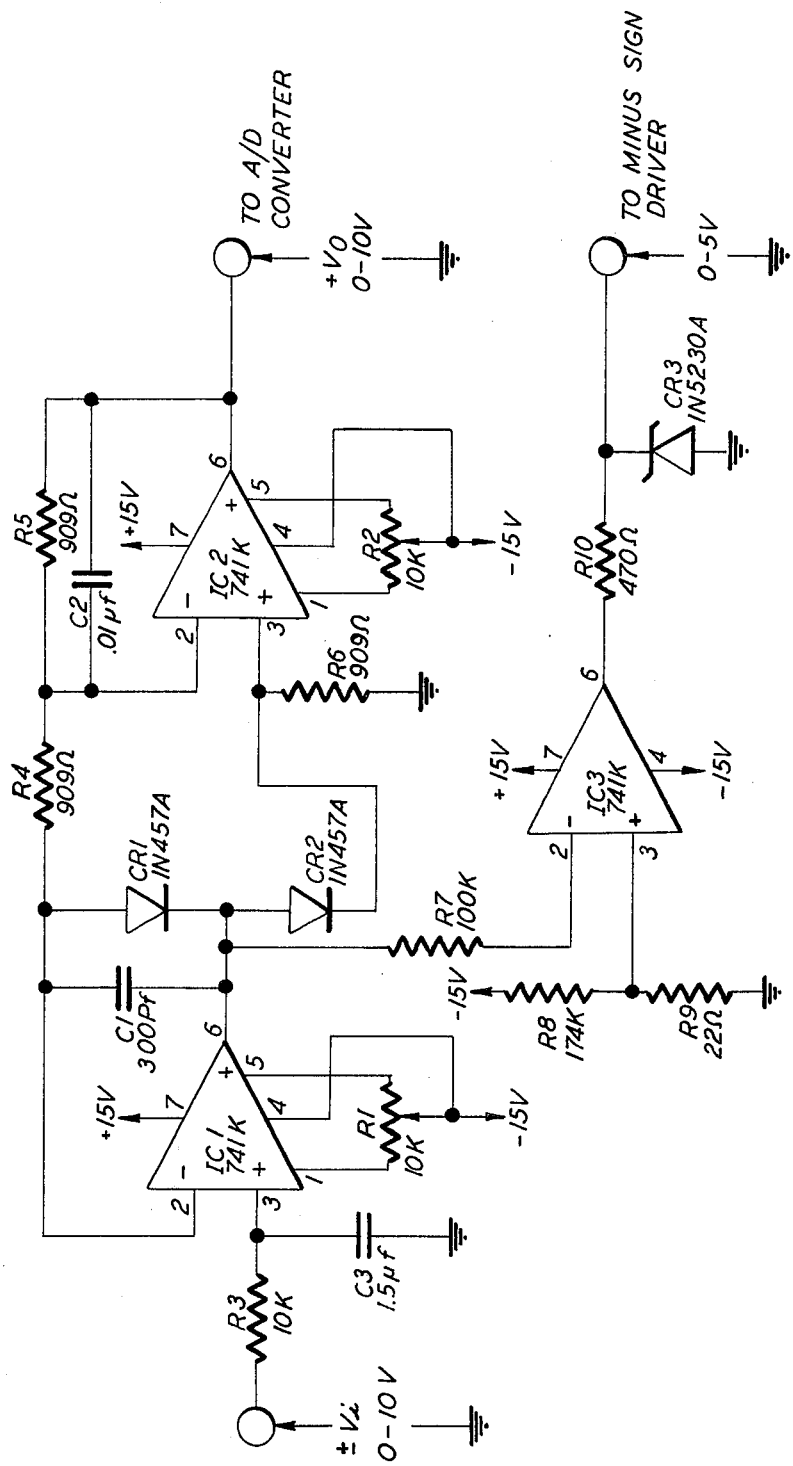

Referring to the drawing, analog input signal $V_i$ typically having a range between $-10$ and $+10$ volts is coupled via a resistor R3 to the noninverting input of a first operational amplifier IC1 which serves as an isolation circuit to isolate the remaining circuitry from the preceeding circuitry and provide an input impedance which is very high so as to provide a negligible load to the preceeding circuitry. For the circuit shown in the drawing, the input impedance is typically in the order of 100 megohms.

The inverting input (pin 3) of operational amplifier IC1 is coupled to ground by a capacitor C3. This capacitor C3 and resistor R3 comprise a low pass filter to remove any high frequency noise from the input to IC1.

Operational amplifier IC1 is provided with a zero offset adjustment circuit which comprises the adjustable resistor R1 which is wired in a conventional manner. The resistor R1 is adjusted so the output at pin 6 of the operational amplifier IC1 is zero whenever the voltage at input pin 3 (the noninverting input) is also zero. This adjustment is made with an accurate calibrating instrument.

The output of the operational amplifier IC1 at pin 6 is coupled to an absolute value circuit which comprises the diodes CR1 and CR2, the resistors R2, R4, R5 and R6, the capicitor C2 and the integrated circuit operational amplifier IC2. These elements are configured together in a manner quite typical for an absolute value circuit whose function is to convert the analog signal appearing at its input (the output of operational amplifier IC1 at pin 6) to a signal having the same magnitude and always positive, polarity. This positive signal appears at the output (pin 6) of the operational amplifier IC2 in the absolute value circuit.

The output (pin 6) of operational amplifier IC2 connects to an analog to digital converter (not shown) so as to provide an easily read indicator of the magnitude of the signal input to IC1. Alternatively, an electromechanical meter may be utilized although an analog to digital converter is much easier to read. With an analog to digital converter, however, the output voltage at pin 6 of IC2 can be measured accurately between −10 volts and −50 microvolts and between +10 volts. It can also be shown that the meter accuracy is acceptable for inputs in the range between −50 and −10 microvolts and 50 and 10 microvolts, however, as will become more apparent, the voltage at the output pin 6 of IC1 oscillates when its input at pin 3 is in the range between −50 and +50 microvolts. As such, the reading at the A/D converter is not completely accurate though it does provide a relative indication with surprising accuracy.

The absolute value circuit also has a conventional zero offset adjustment circuit which includes the adjustable resistor R2 which is adjusted so that the output at pin 6 is zero when the input from pin 6 of IC2 is itself zero. The gain of the absolute value circuit including operational amplifier IC2 is controlled by the resistors in that network so that the magnitude of the signal at the output pin 6 of IC2 is equal to the magnitude of the signal appearing at output pin 6 of the operational amplifier IC1.

The output at pin 6 of operational amplifier IC1 couples via a resistor R7 to the inverting input of a further operational amplifier IC3. The noninverting input pin 3 of operational amplifier IC3 is connected to a resistor divider network comprising resistors R8 and R9 which are configured to apply a very small negative voltage to the noninverting input pin 3 of operational amplifier IC3. Other voltage sources may be connected to pin 3 so that the voltage at pin 2 can be compared with other levels. For the following discussion, the circuit will be described as one for detecting zero volts, however, the actual detection achieved is to indicate that the input is about −10 microvolts. By changing the voltage at pin 3 of IC3, other levels can be detected.

Since operational amplifier IC3 has no feedback, this amplifier is connected in a traditional comparator configuration for comparing the input voltage at pins 2 and 3. Whenever the input voltage at pin 2 is more negative than the input voltage at pin 3, the output at pin 6 of operational amplifier IC3 goes to a logic 1 state which, for the configuration shown, is approximately +5 volts. Whenever the voltage at pin 2 of operational amplifier IC3 is greater than the voltage at pin 3, the output at pin 6 of operational amplifier IC3 goes to a logic zero state or, for the configuration shown, 0 volts.

The output of the operational amplifier IC3 at pin 6 is coupled to a minus sign driver (not shown) for driving the minus sign indication of a typical seven segment display device (also not shown). Whenever the output of the operational amplifier IC3 is positive, i.e., the voltage at pin 2 is more negative than the voltage at pin 3, a logic 1 level signal (+5 volts) is coupled to the sign driver for the seven segment display which thereby causes the sign display to become illuminated. As such, a visible indication is provided to indicate when the voltage appearing at the output of operational amplifier IC1 is more negative than the voltage applied to pin 3 of IC3.

The foregoing description applies to operation of circuit in the drawing where th signals at the input terminal are sufficiently large that either diode CR1 or CR2 is continuously conducting. However, when the amplitude of the signal input to operational amplifier IC1 becomes small enough, i.e., between about +50 and −50 microvolts, neither diode CR1 nor CR2 is continuously conducting and the operational amplifier IC1 no longer operates in stable mode but in oscillation mode due to the circuitry connected thereto especially capacitor C2. When in oscillation mode, IC1 produces an oscillating signal whose frequency is determined by the components within the amplifier IC1 and those cocnnected thereto. The oscillating signal appearing at pin 6 of operational amplifier IC1 is not a perfect square wave but a signal somewhat approximating a square wave. It has been found that the duty cycle of the negative portion of this oscillating signal appearing at pin 6 of operational amplifier IC1 increases as the signal at the input to the operational amplifier IC1 increases negatively from zero to about −50 microvolts.

The oscillating signal is coupled via the resistor R7 to the inverting input (pin 2) of the operational amplifier IC3 which is configured as a comparator. The peak amplitude of the oscillating signal appearing at pin 2 swings between approximately −0.6 volts and +0.6 volts which corresponds approximately to the voltage required to forward bias either the diode CR1 or CR2. Accordingly, the output signal of operational amplifier IC3 swings both positive and negative and the duty cycle of the positive portion of the output signal supplements the duty cycle of the negative portion at pin 2. Since the signals from the output pin 6 of operational amplifier IC3 couple to the negative sign driver for a typical seven segment display device, the minus sign of th display is subject to the pulsations whenever the input voltage to IC1 is oscillating. The positive duty cycle of these pulsations vary as the input to IC1 changes, therefore, the intensity of the light emitted by the minus sign on the seven segment display which responds to the positive duty cycle also varies. Since the negative duty cycle at the output of IC1 decreases as the amplitude of the signal appearing at its input increases towards zero from −50 microvolts, the duty cycle of the positive signal appearing at the output of integrating circuit IC3 decreases thereby reducing the light intensity emitted from the displayed negative sign. Accordingly, the light intensity of the sign indicator can be used by the operator to tell how close the instant setting of the calibration control is to the proper setting for a zero input.

The zero detection circuitry of the drawing does include a capacitor C1 which is connected between the output of operational amplifier IC1 and its inverting input. This capacitor is operative to eliminte high frequency oscillations at the output pin 6 of operational amplifier IC1.

As noted above, the voltage applied to the noninverting input of operational amplifier IC3 is a slightly negative voltage and, correspondingly, the output at pin 6 goes positive whenever the voltage at pin 2 is more negative than the voltage at pin 3. As such, the circuit operates to provide a signal to the minus sign driver whenever a negative signal is applied to the inverting input pin 2 which has a magnitude greater than the negative signal applied to pin 3. Accordingly, the minus sign indicator on the coupled display will start being illuminated when the voltage applied to the input pin 3 of the operational amplifier IC1 becomes slightly negative. Should it be desired to extinguish the minus sign when the input voltage $V_i$ is exactly zero, the voltage at pin 3 of operational amplifier IC3 should then be adjusted until the desired result is achieved. This can be done by replacing resistors R8 and R9 with other resistors having different values or by making one or both resistors R8 and R9 adjustable.

The circuit of the drawing has diodes CR1 and CR2 in the absolute value circuit which serve to control the amplitude of oscillations at the amplifier IC1 output when in oscillation mode. If CR1 and CR2 were replaced each by two diodes in series, the amplitude of the output of IC1 in open circuit mode would be from about $-1.2$ to $+1.2$ volts. Zener diodes can be used in place of CR1 and CR2 to provide other output amplitudes which are a function of the breakdown voltage of the zener diodes.

The above description has focused on a circuit ueful for calibrating analog instruments which relies on utilizing an operational amplifier having a feedback network which places the operational amplifier into stable mode or oscillating mode depending on the magnitude of the input. When in stable mode, the circuit is useful in indicating the magnitude and the polarity of the input. When in oscillating mode, the oscillations and changing duty cycle, produced by adjustment of the instrument calibration control as it raises the input voltage from a negative value toward zero, causes the light intensity of the minus sign indicator to decrease and eventually go out at a level controlled by the voltage at pin 3 of the operational amplifier IC3. Those of skill in the art will recognize that the feedback network of the drawing which includes an absolute value circuit is not the only circuit which will produce the same results so far as the zero detection aspects of the calibration circuit are concerned. For example, the same results are achieved if the anode of CR1 and the cathode of CR2 are grounded and the remainder of the absolute value circuit removed. Other circuits will also produce the same results.

The foregoing description has placed emphasis on the circuit configuration shown in the drawing and modifications therefor, however, those of ordinary skill in the art will recognize that other modifications producing equivalent results may be made to the circuit shown in the drawing without departing from the spirit and scope of the invention as defined in the claims.

What is claimed is:

1. A circuit permitting an operator to accurately calibrate an instrument to produce a zero reading when the input is zero comprising, in combination:
    a first amplifier for receiving a signal whose amplitude is to be indicated;
    a feedback circuit coupled to said first amplifier so that said first amplifier operates in stable mode when the input to said first amplifier is above a first given magnitude and operates in oscillation mode when the input to said first amplifier is below said first given magnitude thereby producing oscillations at the amplifier output;
    a comparator coupled to the output of said first amplifier for producing an output at one level when said first amplifier output is above a second given level and for producing an output at a second level when said first amplifier output is below said second given level, said comparator output being at either said level when said first amplifier operates in stable mode and being an oscillating signal between said two levels when said first amplifier operates in oscillation mode.

2. The circuit of claim 1 wherein said feedback circuit comprises part of an absolute value circuit wherein the circuit components are selected so that the output thereof is always of one polarity and having a magnitude identical to the magnitude of the signal input to said first amplifier.

3. The circuit of claim 1 additionally including a display means coupled to said comparator output to produce a visually observable indication when said comparator output is at one said output level.

4. The circuit of claim 2 additionally including a display means coupled to said comparator output to produce a visually observable indication when said comparator output is at one said output level.

5. A circuit permitting an operator to accurately calibrate an instrument to produce a zero reading when the input is zero, comprising, in combination:
    an operational amplifier with a noninverting input, an inverting input and an output, said non-inverting input for receiving the signal whose amplitude is to be displayed;
    a feedback network coupled between said amplifier output and said inverting input operative to place said amplifier in stable mode whenever the input to said amplifier is above a first threshold amplitude and place said amplifier in oscillation mode whenever the input to said amplifier is below said first threshold amplitude;
    a comparator circuit with two inputs, said comparator producing an output signal at one level when the signal at one said input to said comparator is more negative than the signal at said other comparator input and producing a second output signal at a second level when the signal at said other comparator input is more negative than said one comparator input;
    a level setting circuit for setting the level at said one comparator input; and
    means coupling said other comparator input to said operational amplifier output.

6. The circuit of claim 5 wherein said level setting circuit sets a level at said one comparator input which is offset from zero so that the effective output signal from the comparator becomes zero level as the input to said operational amplifier passes through zero.

7. The circuit of claim 5 wherein said feedback network comprises at least part of an absolute value circuit having an output whose polarity is constant and whose amplitude is identical to the amplitude, regardless of the polarity, of the signal input to said operational amplifier.

8. The circuit of claim 5 additionally including a display means coupled to said comparator output to produce a visually observable indication when said comparator output is at on said output level.

9. The circuit of claim 7 additionally including display means coupled to said comparator output to produce a visually observable indication when said comparator output is at one said output level.

10. A circuit for accurately calibrating an instrument to produce a zero reading when the input is zero comprisin, in combination:
an operational amplifier with an inverting input, a non-inverting input and an output;
an absolute value circuit coupled to the output of said operational amplifier and operative to produce an output signal with one polarity and a magnitude equal to the magnitude of the signal at the input of said amplifier;
said absolute value circuit being connected to said amplifier in a manner creating a feedback path so that said operational amplifier operates in stable mode when a signal input to said amplifier input is above a threshold magnitude and operates in oscillation mode when a signal at said amplifier input is below said threshold magnitude concomitantly causing the output of said operational amplifier to oscillate;
a source having a selectable potential;
a second operational amplifier with an inverting input coupled to the output of said first mentioned operational amplifier and a non-inverting input coupled to said source for producing an output at one level whenever said first mentioned operational amplifier output is more negative than the potential of said source and producing an output at a second level whenever the potential of said source is more negative than the potential at said first mentioned operational amplifier output.

* * * * *

UNITED STATES PATENT AND TRADEMARK OFFICE
CERTIFICATE OF CORRECTION

PATENT NO. : 4,037,154
DATED : July 19, 1977
INVENTOR(S) : Morteza M. Chamran & Allen R. Nemec It is certified that error appears in the above-identified patent and that said Letters Patent are hereby corrected as shown below:

Column 1, line 46 after "comparator" insert --output--.

Column 2, line 62 delete "ICI" and insert in place thereof --IC1--.

Column 3, line 2 delete "ICI" and insert in place thereof --IC1--.

Column 3, line 33 after "between" insert --+50 microvolts and--.

Column 4, line 24 delete "th" and insert in place thereof --the--.

Column 4, lines 35 and 36 delete "cocnnected" and insert in place thereof --connected--.

Column 4, line 58 delete "th" and insert in place thereof --the--.

UNITED STATES PATENT OFFICE
CERTIFICATE OF CORRECTION

Patent No. 4,037,154　　　　Dated July 19, 1977

Inventor(s) Morteza M. Chamran et al.

It is certified that error appears in the above-identified patent and that said Letters Patent are hereby corrected as shown below:

Column 7, line 11, delete "on" and insert -- one --.

Column 7, lines 17 and 18, delete "comprisin" and insert -- comprising --.

Signed and Sealed this

Twenty-second Day of November 1977

[SEAL]

Attest:

RUTH C. MASON　　　　LUTRELLE F. PARKER
Attesting Officer　　　　Acting Commissioner of Patents and Trademarks